United States Patent
Hsu (10) Patent No.: US 11,378,445 B2
(45) Date of Patent: Jul. 5, 2022

(54) OPTICAL SENSING MODULE COMPRISING A LIGHT GUIDE ELEMENT NOT REQUIRED TO BE ALIGNED WITH THE APERTURE OF AN ELECTRONIC DEVICE

(71) Applicant: SensorTek technology Corp., Hsinchu County (TW)

(72) Inventor: Feng-Jung Hsu, Hsinchu County (TW)

(73) Assignee: SensorTek technology Corp., Hsinchu County (TW)

( * ) Notice: Subject to any disclaimer, the term of this patent is extended or adjusted under 35 U.S.C. 154(b) by 167 days.

(21) Appl. No.: 16/447,976

(22) Filed: Jun. 21, 2019

(65) Prior Publication Data

US 2019/0391008 A1    Dec. 26, 2019

Related U.S. Application Data

(60) Provisional application No. 62/687,819, filed on Jun. 21, 2018.

(51) Int. Cl.

| | | |
|---|---|---|
| *G01J 1/04* | (2006.01) | |
| *H05K 1/02* | (2006.01) | |
| *F21V 8/00* | (2006.01) | |
| *G01J 1/02* | (2006.01) | |

(52) U.S. Cl.
CPC ........... *G01J 1/0474* (2013.01); *G01J 1/0266* (2013.01); *G01J 1/0437* (2013.01); *G02B 6/0011* (2013.01); *H05K 1/0274* (2013.01); *H05K 2201/0108* (2013.01); *H05K 2201/10121* (2013.01)

(58) Field of Classification Search
CPC ...... G01J 1/0266; G01J 1/0437; G01J 1/0474; G02B 6/0011; G02B 5/0278
USPC .......................... 250/216, 214.1, 227.11, 239
See application file for complete search history.

(56) References Cited

U.S. PATENT DOCUMENTS 10,553,179 B2 *  2/2020  Holenarsipur ............ G01J 1/44
2008/0210851 A1    9/2008  Arnold

FOREIGN PATENT DOCUMENTS

| CN | 107911506 A | 4/2018 |
|---|---|---|
| TW | 200908310 | 2/2009 |

* cited by examiner

*Primary Examiner* — Que Tan Le
(74) *Attorney, Agent, or Firm* — Winston Hsu (57) ABSTRACT

An optical sensing module for an electronic device is provided. The electronic device includes an opaque layer and an aperture formed on the opaque layer, wherein the optical sensing module includes an optical sensor; a light guide element, disposed between the opaque layer and the optical sensor and configured to guide light to the optical sensor through the aperture; and a diffusing layer, disposed between the opaque layer and the light guide element, configured to diffuse the light to the light guide element.

10 Claims, 8 Drawing Sheets

OPTICAL SENSING MODULE COMPRISING A LIGHT GUIDE ELEMENT NOT REQUIRED TO BE ALIGNED WITH THE APERTURE OF AN ELECTRONIC DEVICE

CROSS REFERENCE TO RELATED APPLICATION

This application claims the benefit of U.S. provisional application No. 62/687,819, filed on 2018 Jun. 21 and included herein by reference in its entirety.

BACKGROUND OF THE INVENTION

1. Field of the Invention

The present invention relates to an optical sensing module, and more particularly, to an optical sensing module capable of maintaining a broad field of view (FOV) range.

2. Description of the Prior Art

With recent technological advancements, display panels of consumer electronic products are maximized to increase the overall coverage percentage, thereby achieving a full display. A characteristic of the full display is that the rim of the display panel is minimized for greater attractiveness. In order to achieve this goal, however, an aperture of a conventional optical sensing device of the display panel needs to be shrunk, or the conventional optical sensing device needs to be disposed at a deeper position within the electronic product. Under these situations, a range of the field of view (FOV) of the optical sensing module is limited and the sensing efficiency is decreased, since a light detecting channel becomes too narrow and long. Although prior arts utilize a diffusing structure to increase the FOV range, a penetration rate of the light is significantly decreased and cannot be transmitted to a deeper place within the structure after the light passes through the diffusing structure, which decreases a sensitivity of the optical sensing module. Therefore, an improvement to the conventional technique is necessary.

SUMMARY OF THE INVENTION

In order to solve the above mentioned problems, the present invention provides an optical sensing module capable of maintaining a broad FOV range when applied to a deeper structure or one with a smaller aperture.

In an aspect, the present invention discloses an optical sensing module for an electronic device, wherein the electronic device includes an opaque layer and an aperture formed on the opaque layer, and the optical sensing module comprises: an optical sensor; a light guide element, disposed between the opaque layer and the optical sensor and configured to guide light to the optical sensor through the aperture; and a diffusing layer, disposed between the opaque layer and the light guide element, configured to diffuse the light to the light guide element.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
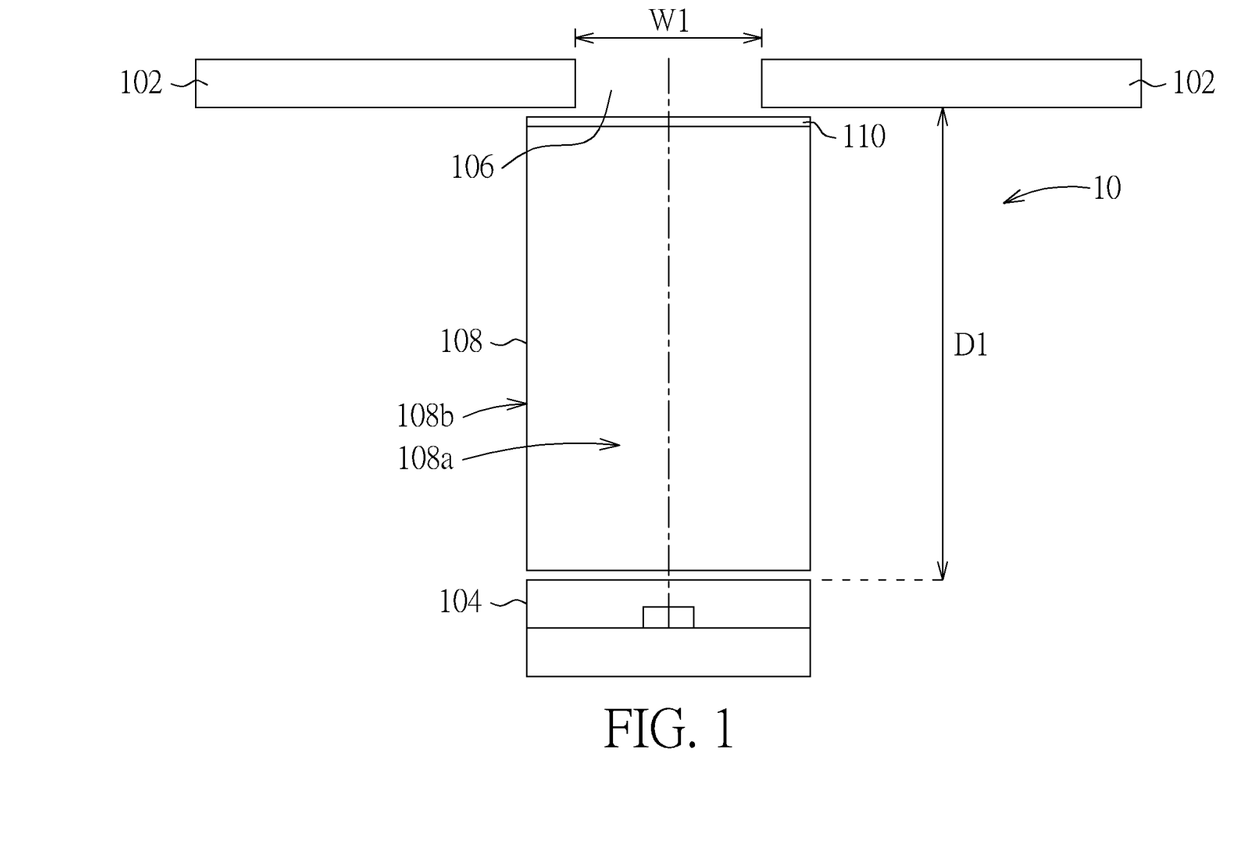
FIG. 1 is a schematic diagram of an optical sensing module according to an embodiment of the present invention.

Refer to FIG. 1, which is a schematic diagram of an optical sensing module 10 according to an embodiment of the present invention. The optical sensing module 10 includes an optical sensor 104, a light guide element 108 and a diffusing layer 110. The optical sensing module 10 may be applied on an electronic device, which includes an opaque layer 102 and an aperture 106 formed on the opaque layer 102 configured to guide light in and out of the aperture 106. For example, the aperture 106 may be defined by ink. The opaque layer 102 is coated with the ink to block the light, and the region without the ink may be the aperture 106, or the aperture 106 may be glass, plastic plate or other transparent materials disposed on the opaque layer 102. The light guide element 108 is disposed between the opaque layer 102 and the optical sensor 104, and configured to guide the light to the optical sensor 104 through the aperture 106. The diffusing layer 110 may be a structural diffusion structure or a coated particle diffusion structure, disposed between the opaque layer 102 and the light guide element 108, for diffusing the light into the light guide element 108, such that the light is more uniform. For example, the diffusing layer 110 may be composed of the light guide element 108, which is close to a top surface of the opaque layer 102, i.e. the top surface of the light guide element 108 is processed by atomization or formed by a non-planar structure, so as to guide the diffused light to the light guide element 108 after the diffused light enters the optical sensing module 10. Alternatively, the diffusing layer 110 may be a transparent light guide film formed via a coating or particles, disposed between the opaque layer 102 and the light guide element 108 to guide the diffused light to the light guide element 108 after the diffused light enters the optical sensing module 10. Therefore, the optical sensing module 10 of the present invention utilizes the uniformly diffusing structure of the diffusing layer 110 to uniformly guide light to the light guide element 108. The light guide element 108 collects the light to the optical sensor 104 to obtain a better field of view (FOV) and sensing efficiency.

In detail, the aperture 106 of the optical sensing module 10 has a diameter W1 and the optical sensor 104 has a depth D1. When the diameter W1 of the aperture 106 is smaller or the depth D1 is larger, a range of the FOV of the optical sensing module 10 becomes smaller, making it difficult to transmit light to the optical sensor 104. When the optical sensing module 10 of the present invention is utilized on a deeper structure or one with a smaller aperture, however, the light is uniformly diffused after entering the optical sensing module 10 through the diffusing layer 110, such that the light guide element 108 uniformly collects the light to the optical sensor 104 to thereby increase the FOV of the optical sensing module 10, which increases the sensing efficiency of the optical sensing module 10.

In an embodiment, the light guide element 108 may be a light guide column composed of Polycarbonate (PC), Polymethyl methacrylate (PMMA), glasses or transparent materials. The light guide element 108 collects the light entering the optical sensing module 10, which is diffused by the diffusing layer 110 to the optical sensor 104. In other embodiments, however, the light guide element 108 may be composed of a cavity surrounded by a light reflective layer. For example, since the optical sensing module 10 is disposed inside the electronic device in practical applications, a central part 108a of the light guide element 108 may be the cavity inside the electronic device, and the central part 108a is surrounded by a peripheral part 108b of the light guide element 108. The peripheral part 108b may be a light reflective layer composed of a reflective plate or a reflective coating, such that the light guide element 108 may collect the light entering the optical sensing module 10, which is diffused by the diffusing layer 110, and transmit the light to the optical sensor 104.

Since the diffusing layer 110 is disposed between the opaque layer 102 and the light guide element 108, in an embodiment, when the incident light is uniformly diffused by the diffusing layer 110, the light guide element 108 may collect a larger range of light and further obtain a larger FOV without the alignment with the aperture 106 or the optical sensor 104. In addition, after the incident light uniformly passes through the diffusing layer 110, the light guide element 108 may effectively collect the diffused light to the optical sensor 104, so as to increase sensitivity of the optical sensing module 10. In this way, the optical sensing module of the present invention may be utilized on a deeper structure and with a smaller aperture to achieve a required broad FOV, e.g. an ambient light sensor (ALS).

Figure 2:
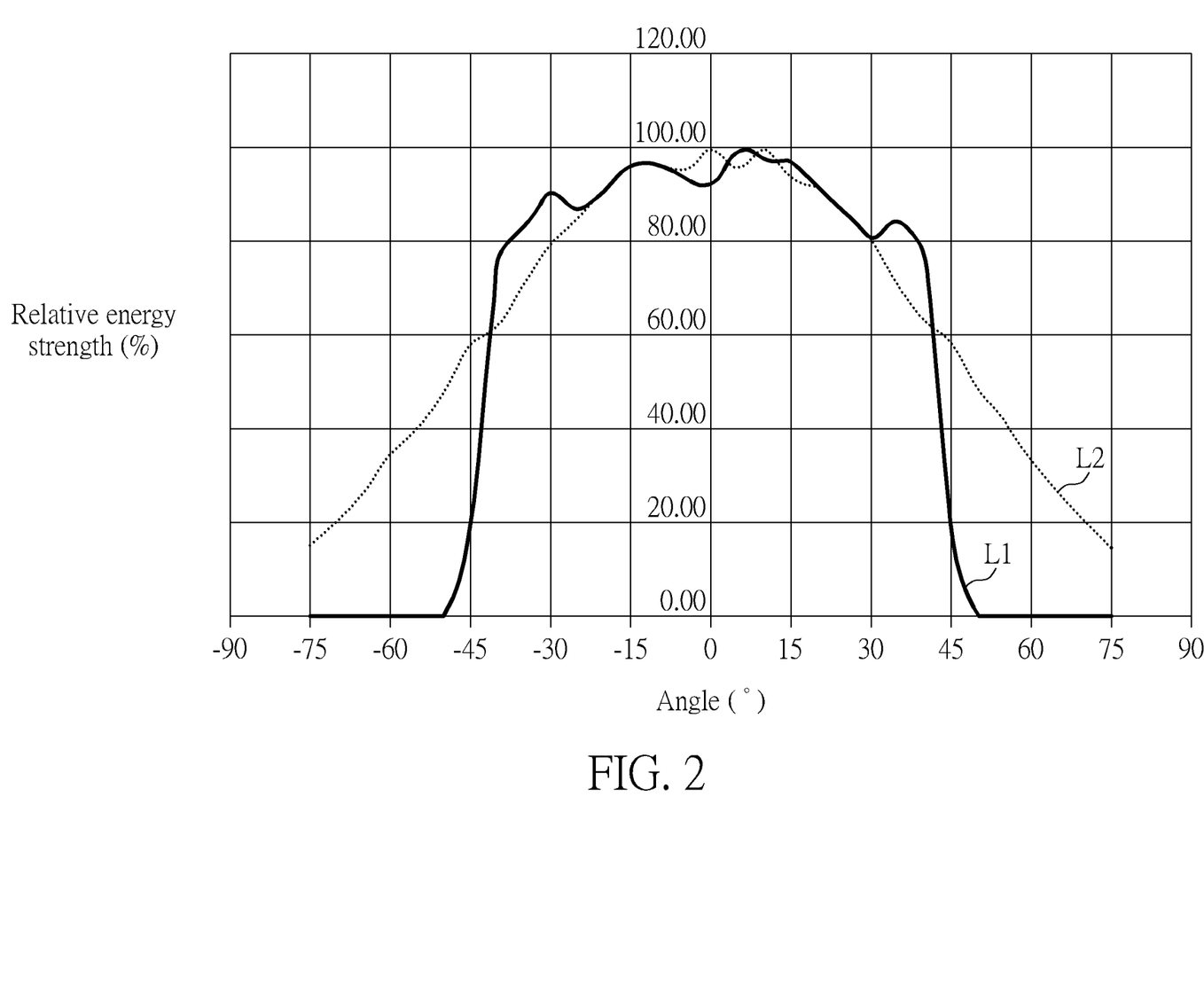
FIG. 2 is a comparison schematic diagram between a field of view range and an energy strength of an optical sensor when an optical sensing module according to an embodiment of the present invention and a conventional optical sensing module are applied on a structure with a smaller aperture and shallower depth.

Refer to FIG. 2, which is a comparison schematic diagram of the FOV range and energy strength of the optical sensor when the optical sensing module 10 and a conventional optical sensing module are applied on a structure, where the diameter W1 of the aperture 106 is 1 mm and the depth D1 is 0.5 mm of the applied structure. The x-axis in FIG. 2 represents the angle of the FOV and the y-axis represents a relative energy strength percentage of the light received by the optical sensor 104. Those skilled in the art may understand that the relative energy strength percentage is a result of normalizing the measured energy strength of the light received by the optical sensor 104 at each angle. In FIG. 2, a solid curve L1 represents a relationship between the FOV and the energy strength of an optical sensing module without any light guide structure and light diffusing structure and a dotted curve L2 represents a relationship between the FOV and the energy strength of the optical sensing module 10 of the present invention. If the energy strength 50% is taken as a standard of good sensing of the optical sensor, when the diameter W1 of the aperture of the applied structure is smaller (e.g. 1 mm), and the depth D1 of the optical sensor 104 is shallower (e.g. 0.5 mm), the FOV of the conventional optical sensing module is within ±40 degrees. Comparatively, the FOV of the optical sensing module 10 according to the embodiment of the present invention is about ±50 degrees. That is, when the aperture of the applied structure is smaller, the FOV of the optical sensing module 10 according to the embodiment of the present invention is larger than that of the conventional optical sensing module.

Figure 3:
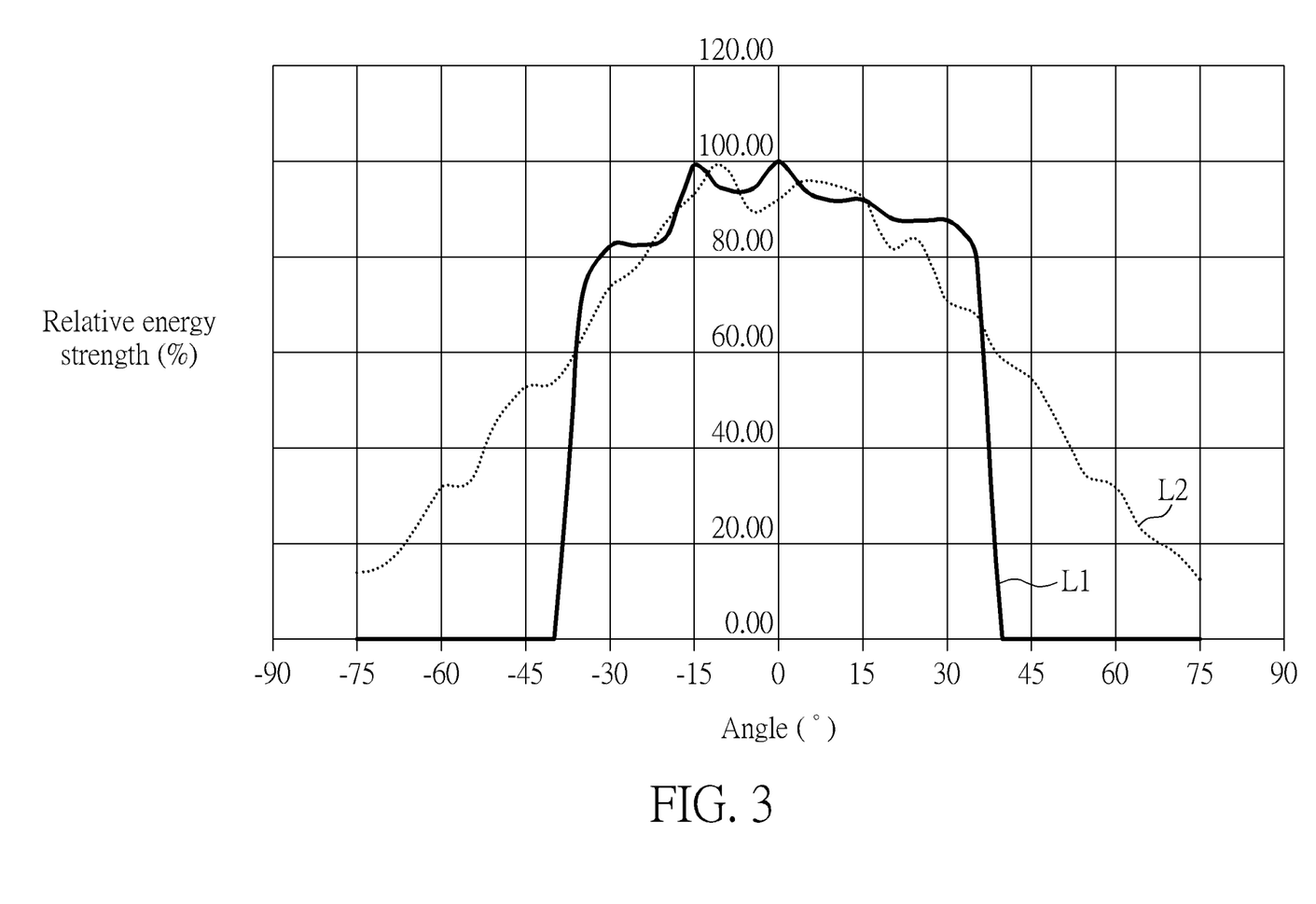
FIG. 3 is a comparison schematic diagram between a field of view range and an energy strength of an optical sensor when an optical sensing module according to an embodiment of the present invention and a conventional optical sensing module are applied on a structure with a smaller aperture and shallower depth.

Refer to FIG. 3, which is a comparison schematic diagram of the FOV range and energy strength of the optical sensor, when the optical sensing module 10 and a conventional optical sensing module are applied on a structure, where the diameter W1 of the aperture 106 is 5 mm and the depth D1 is 3.5 mm of the applied structure. The x-axis of FIG. 3 represents the angle of the FOV and the y-axis represents a relative energy strength percentage of the light received by the optical sensor 104. In FIG. 3, a solid line L1 represents a relationship between the FOV and the energy strength of an optical sensing module without any light guide structure and light diffusing structure and a dotted curve L2 represents a relationship between the FOV and the energy strength of the optical sensing module 10 of the present invention. When the diameter W1 of the aperture 106 of the applied structure is larger (e.g. 5 mm), but the depth D1 of the optical sensor 104 of the applied structure is deeper (e.g. 3.5 mm), the FOV of the conventional optical sensing module is within ±35 degrees. Comparatively, the FOV of the optical sensing module 10 according to the embodiment of the present invention is about ±50 degrees. That is, when the optical sensor 104 is applied on the deeper structure, the FOV of the optical sensing module 10 according to the embodiment of the present invention is larger than that of the conventional optical sensing module.

Figure 4:
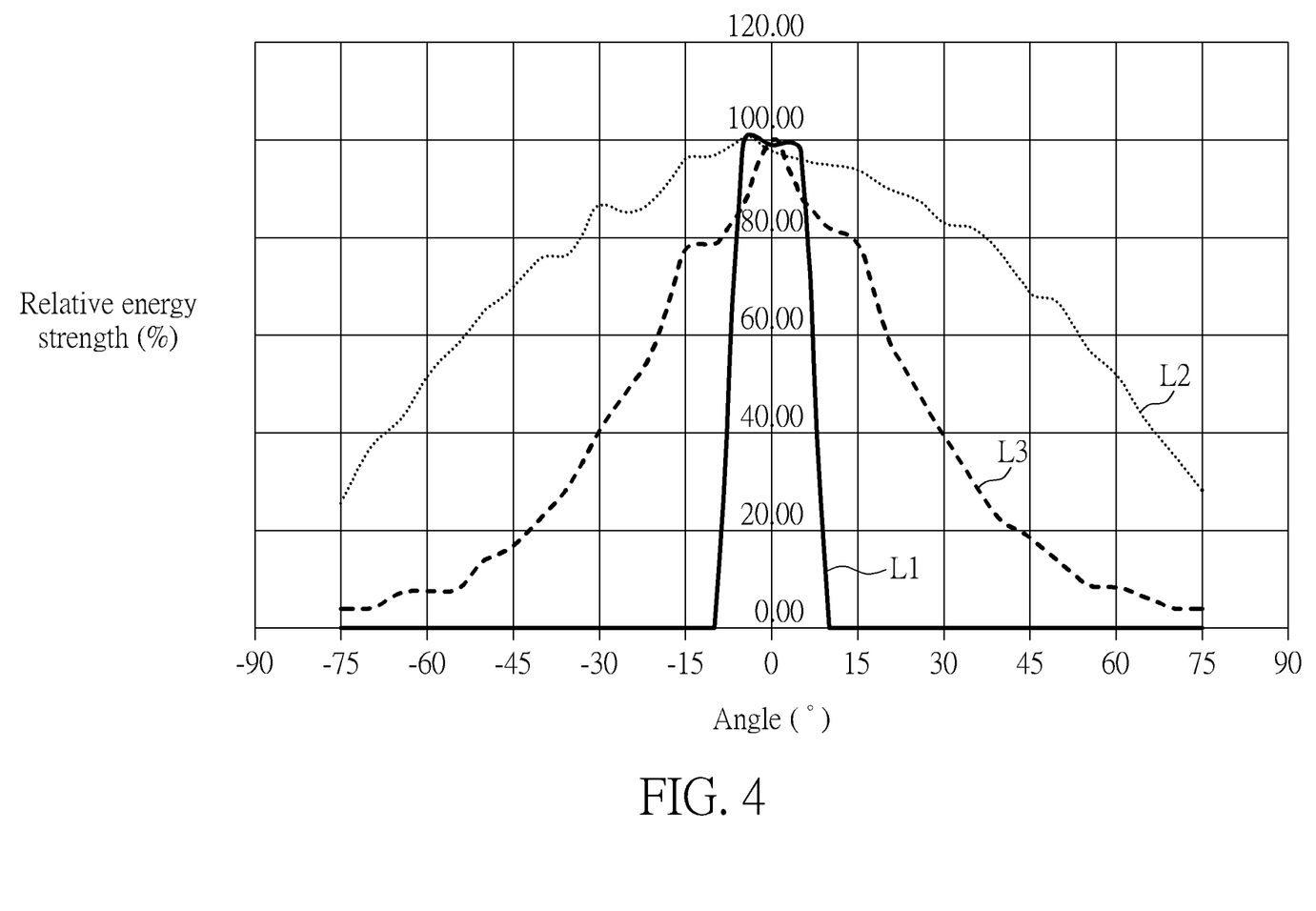
FIG. 4 is a comparison schematic diagram between a field of view range and an energy strength of an optical sensor when an optical sensing module according to an embodiment of the present invention and two different conventional optical sensing modules are applied on a structure with a smaller aperture and shallower depth.
Figure 5:
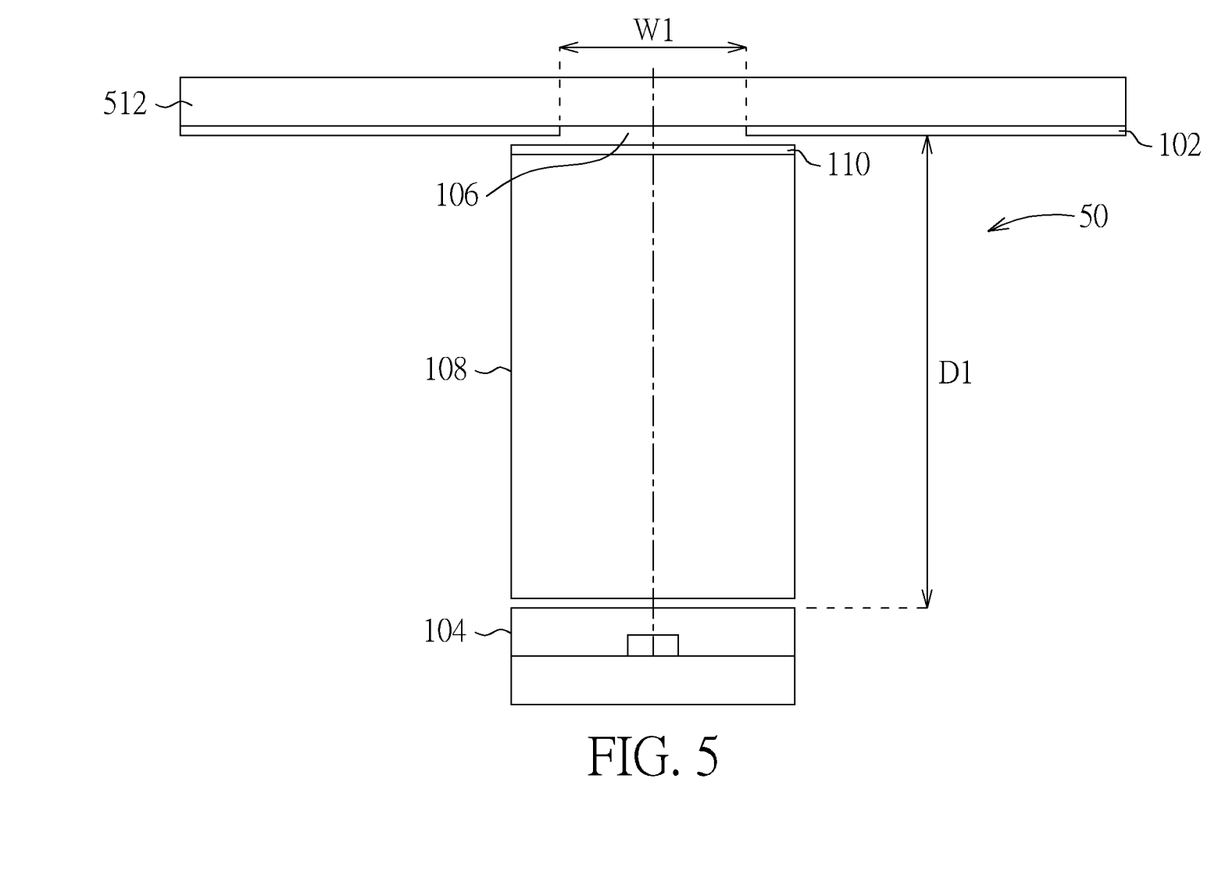
FIG. 5 is a schematic diagram of another optical sensing module according to an embodiment of the present invention.

Refer to FIG. 4, which is a comparison schematic diagram of the FOV range and energy strength of the optical sensor, when the optical sensing module 10 according to an embodiment of the present invention and two different conventional optical sensing modules are applied on a structure, where the diameter W1 of the aperture 106 is 1 mm and the depth D1 of the applied structure is 3.5 mm. The x-axis in FIG. 4 represents the angle of the FOV and the y-axis represents a relative energy strength percentage of the light received by the optical sensor 104. In FIG. 4, a solid curve L1 represents a relationship between the FOV and the energy strength of an optical sensing module without any light guide structure and light diffusing structure, a dotted curve L2 represents a relationship between the FOV and the energy strength of the optical sensing module 10 of the present invention, and a short-line curve L3 represents a relationship between the FOV and the energy strength of an optical sensing module with a light diffusing structure but without any light guide structure. When the diameter W1 of the aperture of the applied structure is smaller (e.g. 1 mm) and the depth D1 of the optical sensor 104 of the applied structure is deeper (e.g. 3.5 mm), the FOV of the conventional optical sensing module without any light guide structure and light diffusing structure is narrowed down to about ±10 degrees. On the other hand, when the optical sensing module has a light diffusing structure but no light guide structure, it is noted that the energy strength received by the optical sensor is significantly attenuated when the FOV increases, such that the FOV is about ±25 degrees, which negatively affects the sensing efficiency. Comparatively, the FOV of the optical sensing module 10 according to the embodiment of the present invention is maintained at about ±60 degrees. In addition, attenuation of the energy strength received by the optical sensor 104 is relatively moderate when the FOV increases, which maintains a better FOV and sensing efficiency of the optical sensing module 10 according to the embodiment of the present invention.

As can be known from the above, when the applied structure of the optical sensing module 10 has a smaller diameter W1 of the aperture 106 or a deeper depth D1 of the optical sensor 104, the optical sensing module 10 according to the embodiment of the present invention may have a larger FOV and higher sensitivity. In brief, when the applied structure of the optical sensing module 10 has a diameter W1 of the aperture 106 smaller than 5 mm (especially smaller than 3 mm) or a depth D1 of the optical sensor 104 larger than 0.5 mm (especially larger than 2 mm), the optical sensing module 10 according to the embodiment of the present invention may have better FOV and sensing efficiency than the conventional sensing modules; when the applied structure of the optical sensing module 10 has a diameter W1 of the aperture 106 smaller than 1 mm or a depth D1 of the optical sensor 104 larger than 3.5 mm, the optical sensing module 10 according to the embodiment of the present invention may achieve even greater improvement. Hence, the optical sensing module 10 according to the embodiment of the present invention maintains better FOV and sensing efficiency compared to the conventional sensing module, especially for the applied structure with a smaller diameter W1 of the aperture 106 and a deeper depth D1 of the optical sensor 104. In other words, referring to defining a width-to-depth ratio R of the diameter W1 of the aperture 106 and the depth D1 of the optical sensor 104, the optical sensing module 10 according to the embodiment of the present invention may achieve outstanding improvement when the width-to-depth ratio R is smaller than or equal to 1.5.

Notably, the optical sensing module of the present invention is not limited to the embodiment disclosed in FIG. 1. Refer to FIG. 5 to FIG. 8, which are schematic diagrams of optical sensing modules 50, 60, 70, 80 according to embodiments of the present invention. The optical sensing modules 50, 60, 70, 80 of FIG. 5 to FIG. 8 have similar structures to the optical sensing module 10 in FIG. 1; therefore, the elements in the optical sensing modules 50-80 having the same function as those in the optical sensing module 10 are annotated with the same numerals. Compared to FIG. 1, the optical sensing module 50 of FIG. 5 further includes a transparent layer 512 disposed above the opaque layer 102, wherein the transparent layer 512 may be a structure of a panel of the electronic device, a shell, etc.

Figure 6:
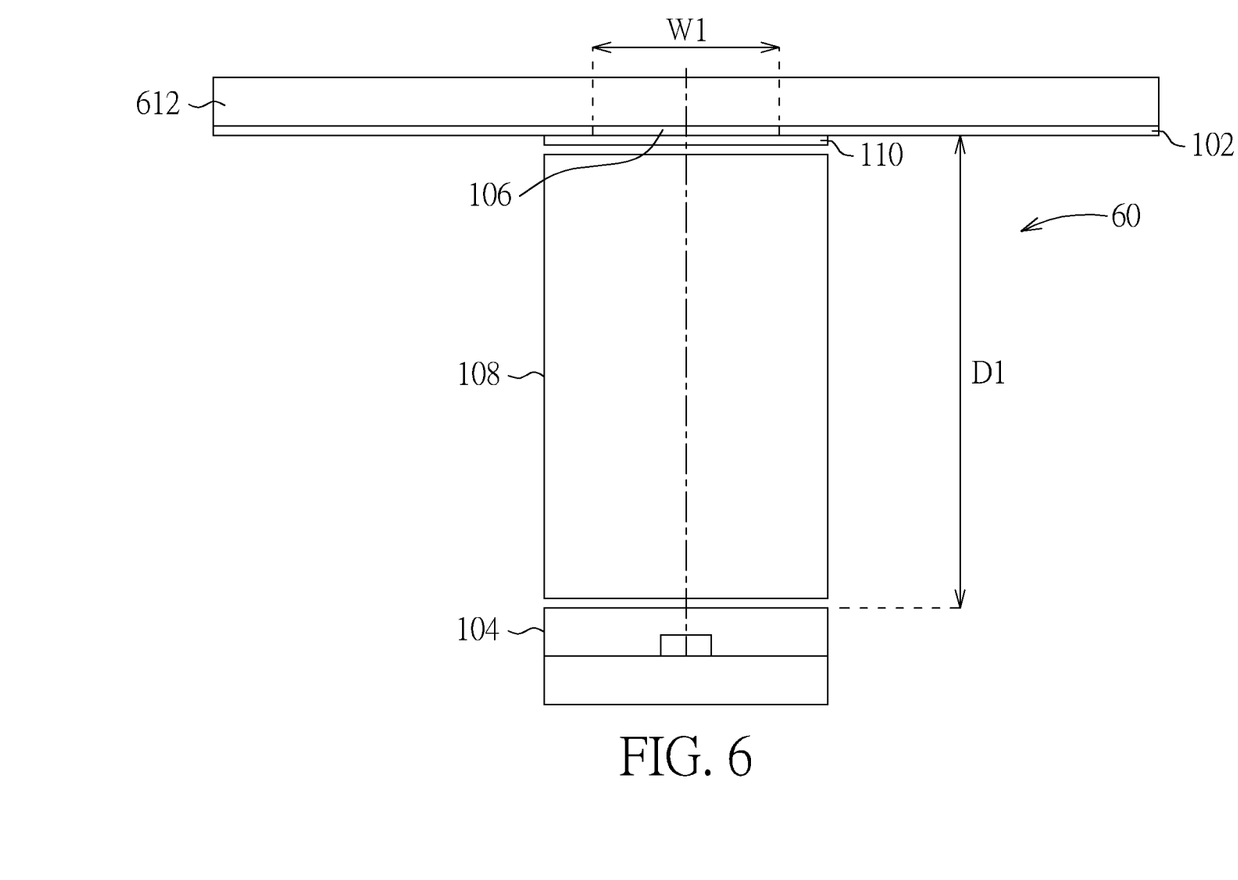
FIG. 6 is a schematic diagram of another optical sensing module according to an embodiment of the present invention.

Compared to FIG. 1, the optical sensing module 60 of FIG. 6 further includes a transparent layer 612 disposed above the opaque layer 102, and the diffusing layer 110 is disposed between the opaque layer 102 and the light guide element 108. In detail, the diffusing layer 110 may be adhered to a top surface of the aperture 106 of the opaque layer 102 and is separated by the light guide element 108.

Figure 7:
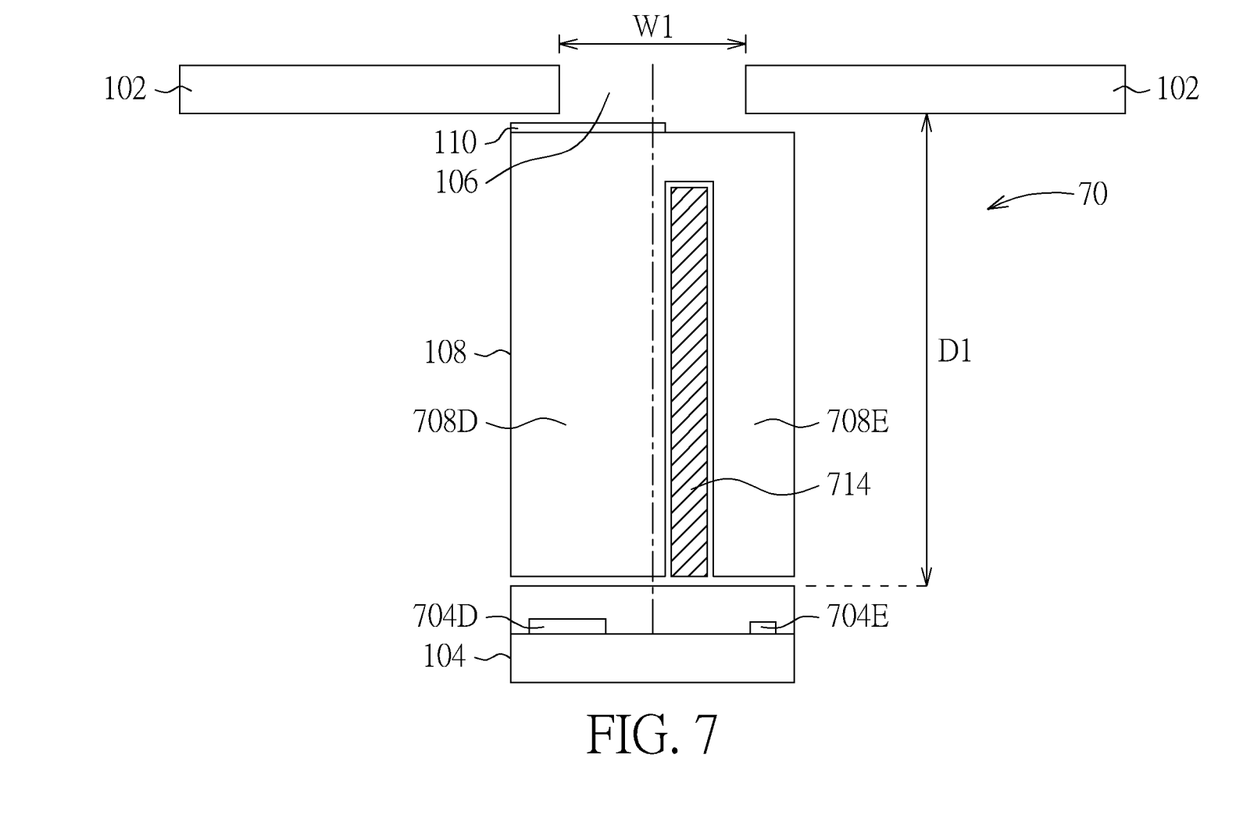
FIG. 7 is a schematic diagram of another optical sensing module according to an embodiment of the present invention.

Compared to FIG. 1, the optical sensor 104 of the optical sensing module 70 shown in FIG. 7 may further include an optical sensor emitter 704E and an optical sensor detector 704D, to respectively emit sensing light and receive incident light. The light guide element 108 may include an opaque partition 714, which divides the light guide element 108 into a light guide emitter 708E and a light guide detector 708D, to guide the light emitted by the optical sensor emitter 704E and guide the incident light received from outside, thereby preventing the light emitted by the optical sensor emitter 704E from directly affecting the optical sensor detector 704D. Notably, the diffusing layer 110 of the optical sensing module 70 may only be disposed on a region corresponding to the optical sensor detector 704D and the light guide detector 708D to diffuse the incident light from outside.

Figure 8:
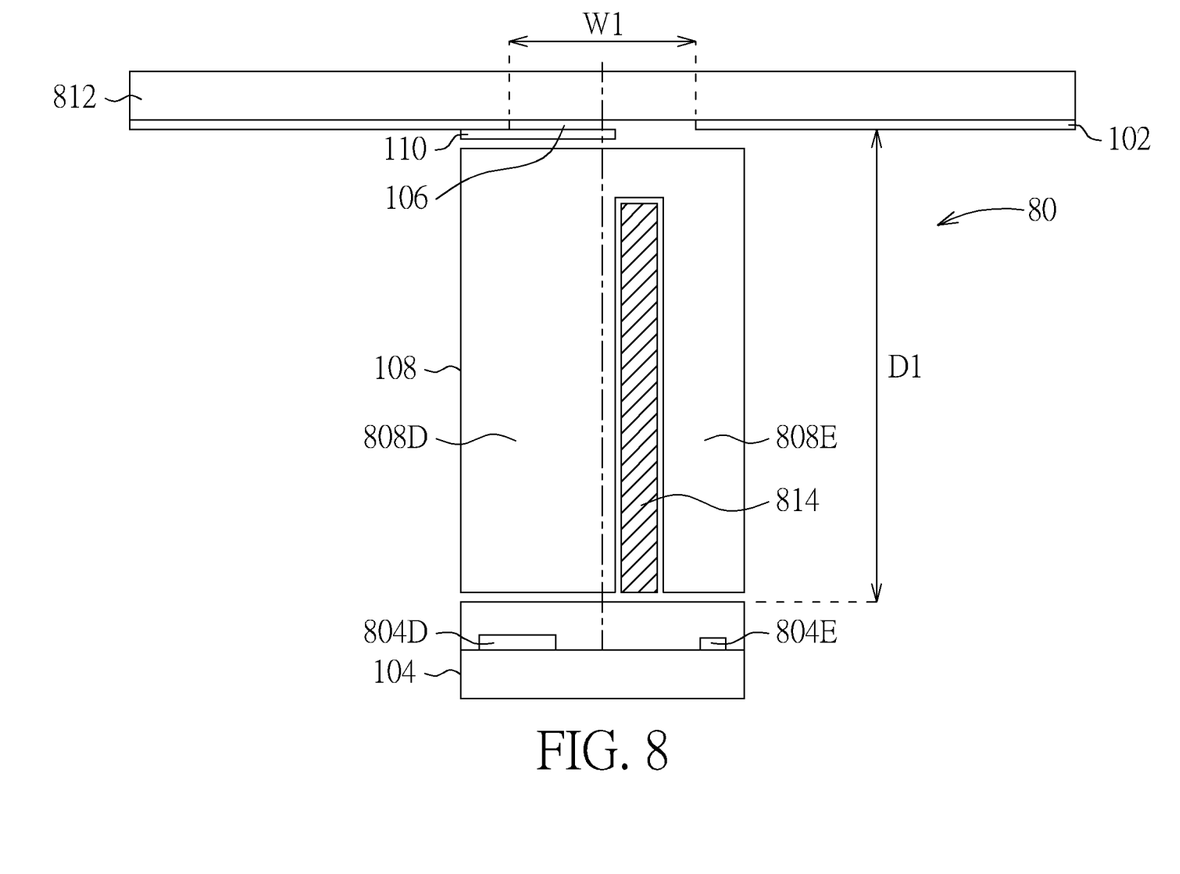
FIG. 8 is a schematic diagram of another optical sensing module according to an embodiment of the present invention.

Compared to FIG. 1, the optical sensing module 80 of FIG. 8 further includes a transparent layer 812, an optical sensor emitter 804E and an optical sensor detector 804D. The transparent layer 812 is disposed above the opaque layer 102, and the light guide element 108 may include an opaque partition 814, which divides the light guide element 108 into a light guide emitter 808E and a light guide detector 808D. In addition, the diffusing layer 110 of the optical sensing module 80 is disposed between the opaque layer 102 and the light guide element 108, wherein the diffusing layer 110 may be adhered to a top surface of the aperture 106 of the opaque layer 102, and is separated from the light guide element 108. Notably, the diffusing layer 110 of the optical sensing module 80 may only be disposed on a region corresponding to the optical sensor detector 804D and the light guide detector 808D.

Those skilled in the art may design the optical sensing module according to different system requirements. For example, a shape of the light guide element or a material of the diffusing layer may be modified according to requirements of users or devices, and is not limited to those shapes and materials described in the disclosure. Other shapes and materials also fall within the scope of the present invention.

In summary, the present invention provides an optical sensing module capable of maintaining a broad FOV range of the optical sensing module when the applied structure is deeper or has a smaller aperture, so as to achieve a function of broad FOV of an ambient light sensor.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An optical sensing module for an electronic device, the electronic device comprising an opaque layer and an aperture formed on the opaque layer, wherein the optical sensing module comprises:
 an optical sensor;
 a light guide element, disposed between the opaque layer and the optical sensor and configured to guide light to the optical sensor through the aperture; and
 a diffusing layer, disposed between the opaque layer and the light guide element, configured to diffuse the light to the light guide element;
 wherein a region of the aperture is defined according to a region of the opaque layer;
 wherein the light guide element is not required to be aligned with the aperture or the optical sensor.

2. The optical sensing module of claim 1, wherein the diffusing layer is a structural diffusion structure.

3. The optical sensing module of claim 2, wherein the structural diffusion structure is a non-planar structure processed or formed by atomization.

4. The optical sensing module of claim 1, wherein the diffusing layer has a coated particle diffusion structure.

5. The optical sensing module of claim 4, wherein the coated particle diffusion structure is a transparent light guide film formed by a coating or particles.

6. The optical sensing module of claim 1, wherein the light guide element is a light guide column composed of transparent material.

7. The optical sensing module of claim 1, wherein the light guide element is composed of a cavity surrounded by a light reflective layer.

8. The optical sensing module of claim 1, wherein the optical sensor includes an optical sensor emitter and an optical sensor detector.

9. The optical sensing module of claim 8, wherein the light guide element includes an opaque partition to separate the light guide element into a light guide emitter and a light guide detector.

10. The optical sensing module of claim 1, wherein the aperture is defined by ink, or the aperture is composed of transparent material.

* * * * *